(12) United States Patent
Ma et al.

(10) Patent No.: US 8,620,005 B2
(45) Date of Patent: Dec. 31, 2013

(54) ALL-DIGITAL SPEAKER SYSTEM DEVICE

(75) Inventors: Dengyong Ma, Suzhou (CN); Jun Yang, Suzhou (CN); Jianming Zhou, Suzhou (CN); Guoqiang Chai, Suzhou (CN)

(73) Assignee: Suzhou Sonavox Eletronics Co., Ltd., Suzhou (CN)

( * ) Notice: Subject to any disclaimer, the term of this patent is extended or adjusted under 35 U.S.C. 154(b) by 257 days.

(21) Appl. No.: 13/067,444

(22) Filed: Jun. 1, 2011

(65) Prior Publication Data

US 2012/0099740 A1    Apr. 26, 2012

(30) Foreign Application Priority Data

Oct. 22, 2010    (CN) .......................... 2010 1 0515427

(51) Int. Cl.
*H04R 29/00* (2006.01)
*H04R 27/00* (2006.01)

(52) U.S. Cl.
USPC ................. 381/94.4; 381/59; 381/58; 381/77

(58) Field of Classification Search
USPC ................................. 381/59, 77, 94.4, 58, 82
See application file for complete search history.

(56) References Cited

U.S. PATENT DOCUMENTS

| 6,441,688 | B1 * | 8/2002 | Lau et al. ....................... 330/301 |
| 2005/0007267 | A1 * | 1/2005 | Zogakis et al. ............... 341/143 |
| 2005/0163324 | A1 * | 7/2005 | Neunaber ........................ 381/55 |
| 2006/0049889 | A1 | 3/2006 | Hooley |
| 2009/0161880 | A1 | 6/2009 | Hooley et al. |
| 2010/0158286 | A1 * | 6/2010 | Pompei .......................... 381/191 |
| 2010/0316237 | A1 * | 12/2010 | Elberbaum ................... 381/300 |

* cited by examiner

*Primary Examiner* — Duc Nguyen
*Assistant Examiner* — George Monikang
(74) *Attorney, Agent, or Firm* — Nixon & Vanderhye, PC

(57) ABSTRACT

The present invention disclosed an all-digital speaker system device based on multi-bit Σ-Δ Modulation, comprising an A/D converter, an interpolation filter, a Σ-Δ modulator, a dynamic mismatch regulator, a differential buffer and a speaker array. The present invention takes advantage of the Σ-Δ modulation technique to effectively reduce the cost and complexity of the hardware realization of the speaker system device, thus realizing the full digitalization of the whole sound transmission link and the integration of the system device with low power dissipation and volume. Furthermore, the system device according to the present invention is provided with a better control ability on the local sound field, thus providing a better practicable method for the voice secret transmission.

8 Claims, 6 Drawing Sheets

ALL-DIGITAL SPEAKER SYSTEM DEVICE

FIELD OF THE INVENTION

The present invention relates to a digital speaker, particularly to an all-digital speaker system based on multi-bit Σ-Δ Modulation.

DESCRIPTION OF THE RELATED ART

With the rapid development of the large scale integrated circuit and the digitization technology, inherent limitations of the conventional analog speaker system are getting more and more obvious in power dissipation, volume, weight, as well as in the transmission, storage, and processing of signals, and so on. To overcome the above-mentioned defects, the speaker system R&D work is heading for the low-power dissipation, small outline, digitization and integration. At the emergency of the class-AD digital amplifier based on PWM modulation, the digitization course of the speaker system was promoted to the amplifier part. However, high quality inductors and capacitors of big volume and high price are still required for the post-stage circuit of the digital amplifier passively simulating low-pass filter to eliminate high frequency carrier components, so as to demodulate the original analog signals. In order to reduce the volume and price of the digital amplifier to achieve more integration, a class-BD digital amplifier chip without the need of simulating LC filtering has come into market by a number of oversea chip producers, expecting to make a true all-digital speaker system. Yet, the PWM modulation circuit in such amplifier chips still belongs to the scope of analog circuit designing, wherein, the original analog components for separately realizing PWM modulation technique are photo etched on a small size silicon chip simply in a highly integrated manner, still not reaching the true all-digitalization level.

Apart from the above-mentioned analog implementation of the PWM modulation technique, US patent (US 20060049889A1, US 20090161880A1) disclosed a digital implementation process of the PWM modulation technique, also provided an implement method of an all-digital speaker system based on the technique of PWM modulation and class-BD amplifier. However, there exist two significant barriers in such method of the all-digital speaker system based on the PWM modulation technique: 1. The coding scheme based on the PWM modulation technique has inherent nonlinear defects owning to the structure, making the coded signals generate nonlinear distortion components in the expecting band. If a further linear improvement is needed, the realization difficulty and complexity of the modulation mode will rise sharply. 2. Considering the difficulty of the hardware realization, the low over-sampling rate of the PWM modulation, generally 200 KHz-400 KHz, results in the SNR (Signal to Noise Ratio) of the coded signal difficult to improve subject to the over-sampling rate.

Aiming at the defects of the nonlinear distortion and the low over-sampling rate of the PWM modulation technique on the implementation of the all-digital speaker system, also the need for the low-power dissipation, small outline, digitization and integration, a signal code modulation method that is excellent in performance and simple in realization is desired to realize the true all-digital speaker system device.

SUMMARY OF THE INVENTION

The object of the present invention is to overcome the defects of nonlinear distortion and low over-sampling rate of the PWM modulation technique in the prior art, and provide an all-digital speaker system device based on the multi-bit Σ-Δ modulation with low-power dissipation, small outline, digitization and integration. In order to obtain one or more of these objects, the present invention provides an all-digital speaker system device, comprising:

an A/D converter, for converting the input analog audio signals into multi-bit digital signals in PCM coded format;

an interpolation filter, which is electrically coupled to the output end of the A/D converter, for interpolating the input PCM coded signals of low sampling rate with an over-sampling rate, and removing the periodically continuing spectrum components in the interpolated signals by low-pass filtering;

a Σ-Δ modulator, which is electrically coupled to the output end of the interpolation filter, for modulating the multi-bit Σ-Δ code and shaping noise;

a dynamic mismatch regulator, which is electrically coupled to the output end of the Σ-Δ modulator, for eliminating code errors arisen from the frequency response difference between array elements;

a differential buffer, which is electrically coupled to the output end of the dynamic mismatch regulator, for enhancing the load driving ability of the output end;

a speaker array, which is electrically coupled to the output end of the differential buffer, for realizing electro-acoustic conversion.

Preferably, the Σ-Δ modulator applies a noise-shaping treatment to the over-sampling signals from the interpolation filter according to the signal processing flow of the existing Σ-Δ modulating algorithm, pushing the noise energy out of the sound band to keep high SNR in band.

Specifically, in order to save hardware resource and reduce realization cost during the hardware implementation course, the constant multiplication operation of the Σ-Δ modulator is generally replaced by the shift addition operation, and the parameters of the Σ-Δ modulator are depicted in CSD (Canonical Signed Digit) code. Preferably, the Σ-Δ modulator converts the N bit Σ-Δ PCM coded signals generated by Σ-Δ modulating into equal weight binary coded signals corresponding to $2_N$ transmission channels.

Preferably, the dynamic mismatch regulator takes advantage of the existing element selection algorithm, for example, such as the DWA (Data-Weighted Averaging), the VFMS (Vector-Feedback mismatch-shaping) and the TSMS (Tree-Structure mismatch shaping) or the like, to shape the nonlinear harmonic distortion arisen from the frequency response difference between each array element, reducing the magnitude of the harmonic distortion components in band and pushing the power thereof to the high frequency section out of ban, thus promoting the sound quality of the Σ-Δ coded signals.

Specifically, the differential buffer converts the single channel digital signals sent from the dynamic mismatch regulator into twin channel differential signals, eliminating the common mode noise components in the channel to promote the output sound quality.

Preferably, the elements of the speaker array comprise a plurality of speakers of moving-coil type or piezo-electric type arranged in a certain array location configuration.

Specifically, the distribution of the spatial acoustic field arisen from the speaker array depends on the array location configuration and the Σ-Δ modulation bits digits. With the increase of the array aperture and the number of the array elements resulted from more modulated bits digits, the directionality of the generated spatial acoustic field is turning more and more obvious, wherein, the local region neighboring the symmetry axis of the array is provided with the best sound quality and the maximum sound pressure, while as departing from the best region, the sound quality gradually deteriorates and the sound pressure decreases. Under the circumstance that the array is provided with a larger aperture, the speaker system device according to the present invention is provided with apparent acoustic field control effect which is different from that of the conventional linear array beam-forming technique. This is because the signals emitted by each array element channel of the system device are just part of the bit information of the sound signals, while the signals emitted by each array element of the conventional beam-forming technique are a copy of the sound signals. For the reason that the information amount of the signals emitted by the system device element is different from each other, the generated acoustic field produces not only a variation on the sound pressure amplitude of in space, but also a variation on the harmonic distortion, the Intelligibility and the quality of the sound.

The present invention takes advantage of the $\Sigma$-$\Delta$ modulation technique to convert the high bit PCM coded sound signals into the low bit $\Sigma$-$\Delta$ coded signals, effectively reducing the cost and complexity of the hardware realization of the speaker system device, thus realizing the full digitalization of the whole sound transmission link and the integration of the system device with low power dissipation and volume. In addition, the present invention takes advantage of the dynamic mismatch shaping algorithm, eliminating the nonlinear harmonic distortion arisen from the frequency response difference between each array element, thus promoting the sound quality of the speaker system device. By selecting a proper array location configuration, the speaker system device according to the present invention is provided with apparent acoustic field control effect which is different from that of the conventional linear array beam-forming technique. The generated acoustic field produces not only a variation on the sound pressure amplitude of in space, but also a variation on the harmonic distortion, the Intelligibility and the quality of the sound, thus providing a better practicable method for the voice secret transmission.

BRIEF DESCRIPTION OF THE DRAWINGS

In the course of this detailed description below, references will be made to the drawings, in which.

DETAILED DESCRIPTION OF THE PREFERRED EMBODIMENTS

The detailed description of the preferred embodiment according to the invention is given as below with the accompanying drawings so that the benefits and features of the present invention are understood for those skilled in the art, making an definition of the protection scope of the present invention.

The present invention takes advantage of the $\Sigma$-$\Delta$ modulation technique to convert the conventional high bit PCM coded signals into the low bit $\Sigma$-$\Delta$ PCM coded signals, then the N bit $\Sigma$-$\Delta$ PCM coded signals are converted into equal weight binary coded signals corresponding to 2N transmission channels, which are spatially emitted through 2N transmission speaker elements, whereby, the emitted acoustic field of the speakers is spatially and linearly superposed to composite the original analog sound signals.

Figure 1:
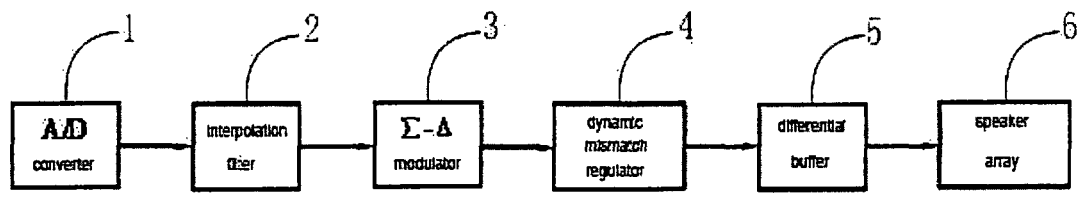
FIG. 1 is a block diagram illustrating the component modules of the all-digital speaker system device according to the present invention.

As shown in FIG. 1, an all-digital speaker system device based on multi-bit $\Sigma$-$\Delta$ Modulation according to the present invention, comprises an A/D converter 1, an interpolation filter 2, a $\Sigma$-$\Delta$ modulator 3, a dynamic mismatch regulator 4, a differential buffer 5 and a speaker array 6.

The A/D converter 1, which converts the analog audio signals of the audio band into PCM coded signals of 24-bit, 48 KHz that read by a FPGA (Field-Programmable Gate Array) chip (type NO. Cyclone III EP3C25Q240C8) through I2S interface, may comprise a PCM1804 chip and a peripheral differential analog buffer circuit. The input end of the interpolation filter 2 is electrically coupled to the output end of the A/D converter 1. The basic working principles are given as follows: the PCM coded signals of 24-bit, 48 KHz are processed with a 3-level up-sampling interpolation inside the FPGA chip, wherein, the 1st level interpolation factor is 4 and the sampling rate is 192 KHz; the 2nd level interpolation factor is 4 and the sampling rate increases to 768 KHz; the 3rd level interpolation factor is 2 and the sampling rate further increases to 1536 KHz. Finally, after the 32 times interpolating, the original signals of 24-bit, 48 KHz are converted into the over-sampling PCM coded signals of 1.536 MHz, 24-bit.

Figure 2:
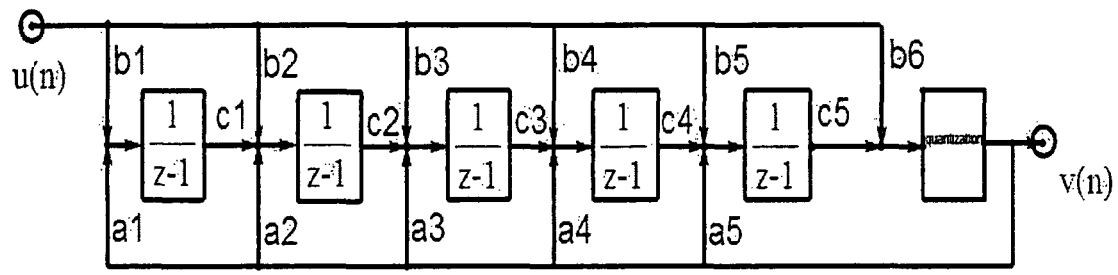
FIG. 2 is a flow diagram of the signal processing of the $\Sigma\Delta$ modulator according to the present invention.

The input end of the $\Sigma$-$\Delta$ modulator 3, which converts the over-sampling PCM coded signals of 1.536 MHz, 24-bit into the $\Sigma$-$\Delta$ modulated signals of 1.536 MHz, 3-bit, is electrically coupled to the output end of the interpolation filter 2. As shown in FIG. 2, in this embodiment, the $\Sigma$-$\Delta$ modulator 3 is provided with a fifth-order CIFB (Cascaded Integrators with Distributed Feedback) topology construction. Provided that the over-sampling factor of the modulator here is 64, the topology construction coefficient of which is shown in list 1, indicating the parameters of the $\Sigma$-$\Delta$ modulator according to the present invention. In order to save hardware resource and reduce realization cost, the constant multiplication operation is generally replaced by the shift addition operation inside the FPGA chip, and the parameters of the Σ-Δ modulator are depicted in CSD code.

List 1

| Parameter | Ideal Parameters | CSD Transformation | CSD Value |
|---|---|---|---|
| a1, b1 | 0.2065 | $2^{-2} - 2^{-5} - 2^{-6}$ | 0.2031 |
| a2, b2 | 0.2109 | $2^{-2} - 2^{-5} - 2^{-7}$ | 0.2305 |
| a3, b3 | 0.2289 | $2^{-2} - 2^{-8} - 2^{-6}$ | 0.3594 |
| a4, b4 | 0.2838 | $2^{-2} + 2^{-9} + 2^{-5}$ | 0.2832 |
| a5, b5 | 0.4656 | $2^{-1} - 2^{-8} - 2^{-5}$ | 0.4648 |
| b6 | 1 | | |
| c1 | 0.1205 | $2^{-3} - 2^{-8} - 2^{-11}$ | 0.1206 |
| c2 | 0.2904 | $2^{-2} + 2^{-5} + 2^{-7}$ | 0.2891 |
| c3 | 0.5926 | $2^{-1} + 2^{-4} + 2^{-5}$ | 0.5938 |
| c4 | 1.3746 | $2^{0} + 2^{-2} + 2^{-3}$ | 1.3750 |
| c5 | 3.8554 | $2^{2} - 2^{-6} - 2^{-3}$ | 3.8594 |

Figure 3:
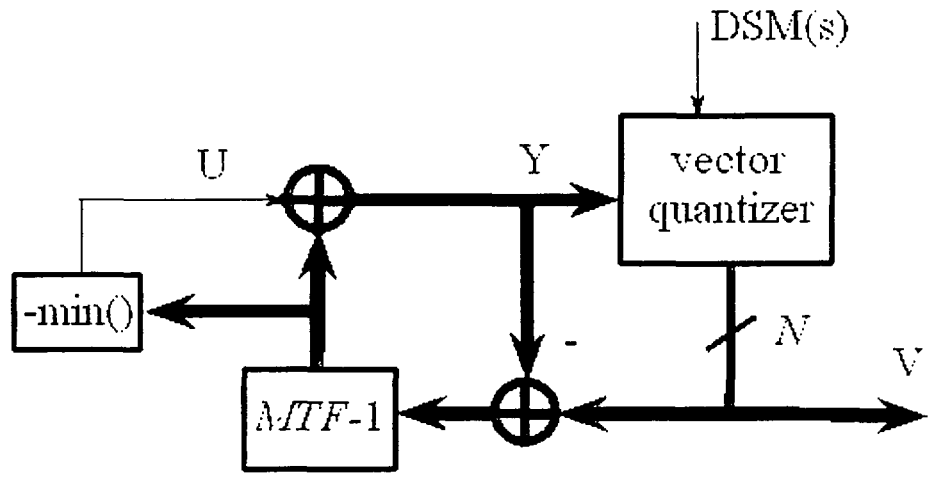
FIG. 3 is a flow diagram showing the signal processing of the dynamic mismatch regulator according to the present invention.

The input end of the dynamic mismatch regulator 4, which eliminates the nonlinear harmonic distortion arisen from the frequency response difference between each array element, is electrically coupled to the output end of the Σ-Δ modulator 3. In this embodiment, the dynamic mismatch regulator takes the VFMS (Vector-Feedback mismatch-shaping) algorithm, the signal processing flow chart of which is shown in FIG. 3. After the processing of the dynamic mismatch regulator, the harmonic components in the original Σ-Δ coded signals are pushed to the high-frequency section out of band inside the FPGA chip, thus enhancing the sound quality of the signals in band.

The input end of the differential buffer 5, which includes two functional parts in this embodiment, is electrically coupled to the output end of the dynamic mismatch regulator 4. One part is located inside the FPGA for outputting the coming output data from the dynamic mismatch regulator 4 both directly and invertedly, producing two differential signal channels. The other part is located outside the FPGA for buffering both differential signal channels by a cache chip (model No. 74HC126).

Figure 4:
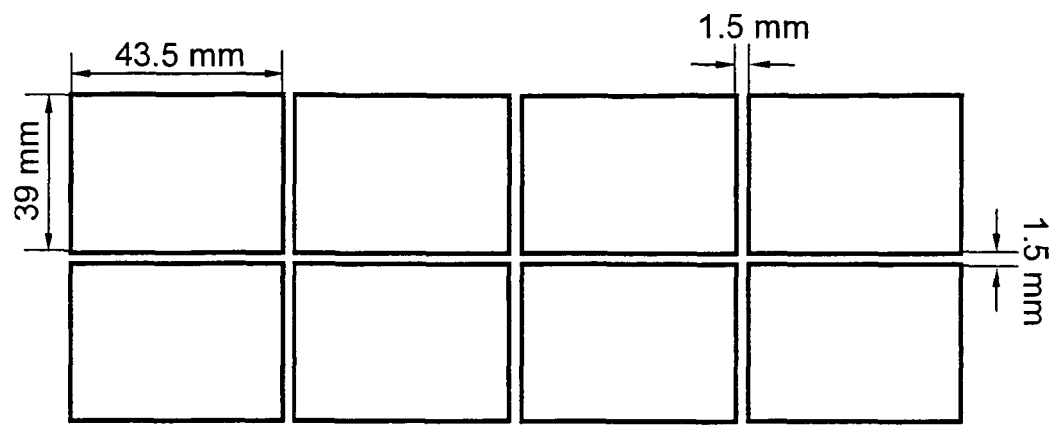
FIG. 4 is a schematic view showing the dimensions of the speaker array according to the present invention.

The input end of the speaker array 6 is electrically coupled to the output end of the dynamic mismatch regulator 4. In this embodiment, the speaker array comprises 8 speaker elements that arranged as shown in FIG. 4, each of which is a speaker with dimensions of 43.5 mm×39 mm×2 mm.

Figure 5:
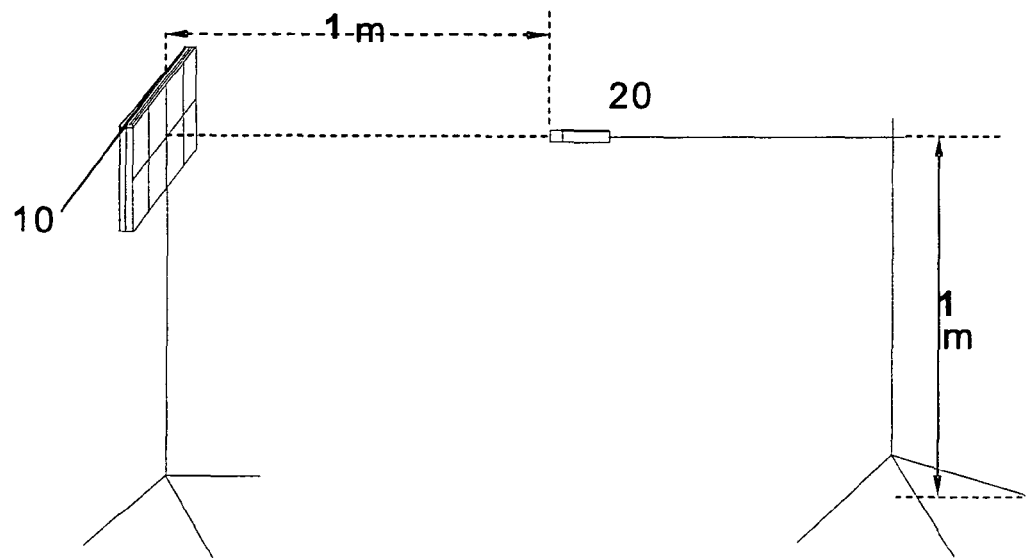
FIG. 5 is a schematic view showing the location configuration of the speaker array and the microphone according to the present invention.
Figure 6:
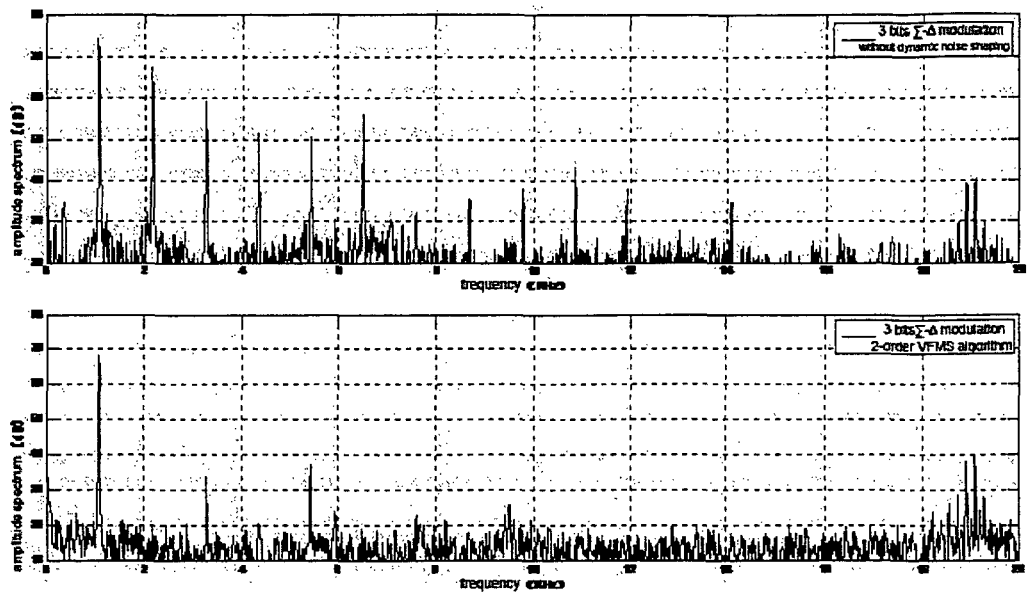
FIG. 6 is a graph showing the test result of the dynamic mismatch regulator according to the present invention.

Performance tests on the all-digital speaker system device according to the present invention have been taken on in the anechoic room. FIG. 5 is a schematic view showing the location configuration of the speaker system device 10 and the microphone 20, wherein, the distance (A) between the center of the speaker system device 10 and the microphone 20 is 1 m, and the distance (B) between the microphone 20 and the ground is 1 m. FIG. 6 shows the test results of the dynamic mismatch regulator eliminating nonlinear harmonic distortion when a single frequency sinusoidal signal of 1 KHz is played. It is noted that after taking the VFMS dynamic mismatch shaping algorithm, the harmonic components are significantly reduced when outputting the signals of 1 KHZ, which indicates that the dynamic mismatch regulator is capable of eliminating nonlinear harmonic distortion.

Figure 7:
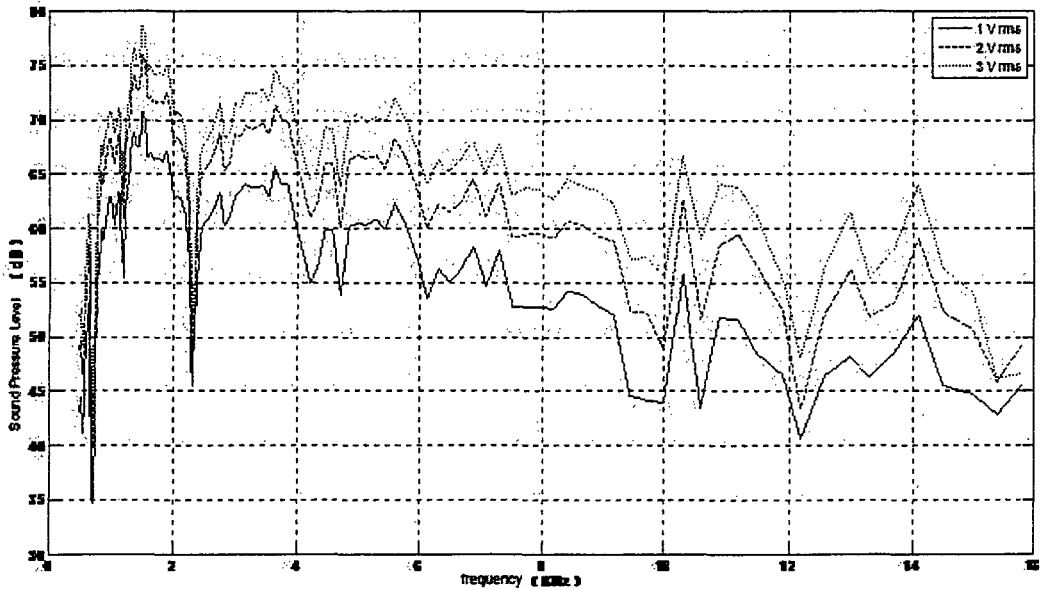
FIG. 7 is a graph showing the frequency response of the system device according to the present invention.
Figure 8:
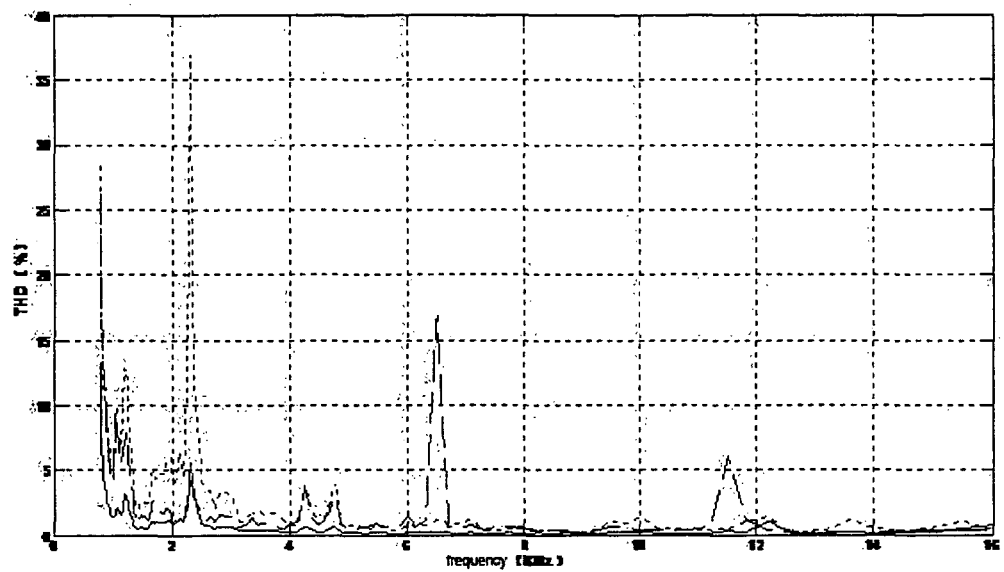
FIG. 8 is a graph showing the total harmonic distortion of the system device according to the present invention.

FIG. 7 is a graph showing the amplitude-frequency response curve obtained 1 m away of the system device according to the present invention, wherein, sweep frequency signals of 1V, 2V, 3V (effective value) are separately input into the speaker system device. It can be seen from the graph that a dramatical decline occurs on the amplitude-frequency response curve of the system device when the frequency exceeds 8 KHZ, resulting from the inherent frequency-response characteristics of the speaker elements in use. The frequency-response of the speaker elements in this embodiment severely attenuates when frequency is larger than 8 KHZ, coursing the frequency-response of the 8 speaker elements system device severely attenuates accordingly. In addition, the acoustic pressure amplitude of the speaker system device will rise gradually with the increase of the input voltage. FIG. 8 is a graph showing the total harmonic distortion of the system device according to the present invention. It can be seen from the graph that the low-frequency region around 1 KHZ is provided with a larger total harmonic distortion, which means a low sound quality of the output signals of the system device in low-frequency band, while the frequency region far away from the low-frequency band is provided with a smaller total harmonic distortion, generally below 1%. In addition, the harmonic distortion of the speaker system device will rise gradually with the increase of the input signal voltage, though several frequency points are provided with a severe harmonic distortion.

Figure 9:
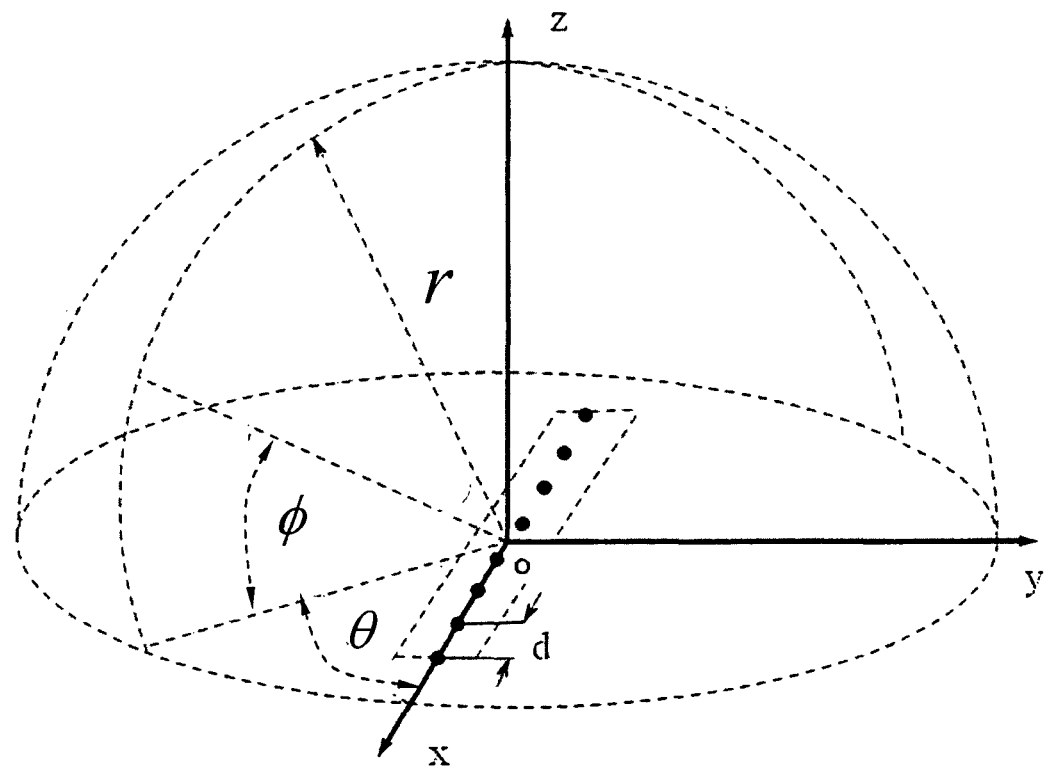
FIG. 9 is a schematic view showing the location configuration of the 8-elements linear array according to the present invention.

In order to throw some light on the local control ability on the spatial acoustic field of the system device according to the present invention, a simulation on the distribution of the acoustic field arisen from the 8 speaker elements is provided with a larger distance between the elements. As shown in FIG. 9, a linear array comprises 8 speaker elements at 0.1 m intervals, each of which is disposed at a certain spatial location. A single frequency sinusoidal signal of 1 KHZ is sent into the system device to generate a 3-bit Σ-Δ coded signal by the Σ-Δ modulator. Then a binary data stream of 8 channels is converted and sent to the 8 speaker elements to proceed spatial emission. As shown in FIGS. 10, 11, and FIGS. 12, 13, the amplitude distribution and the amplitude variation of the spatial acoustic field arisen from the 8 speaker array are obtained by linearly superposing the acoustic field arisen from each element.

Figure 10:
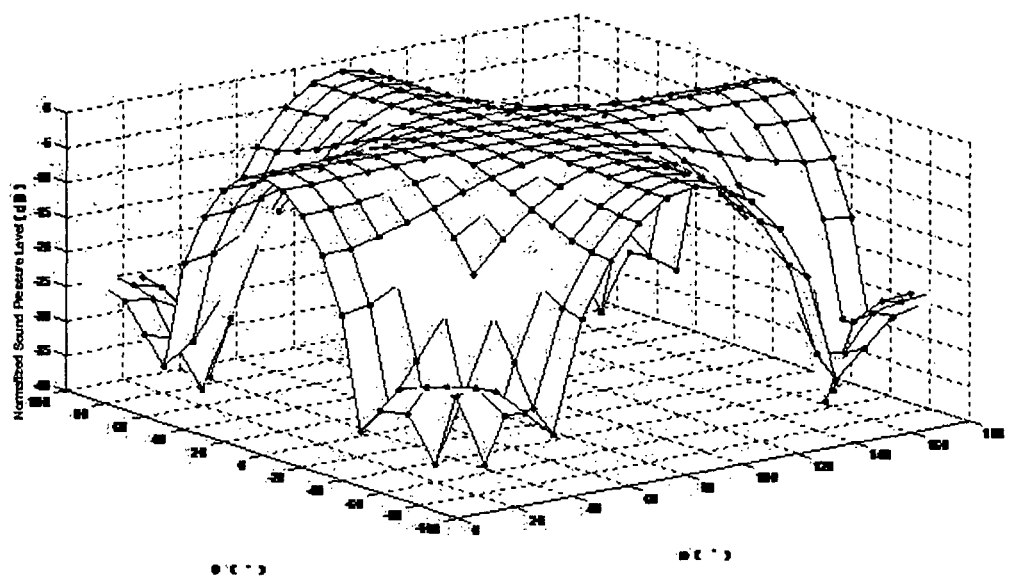
FIG. 10 is a graph showing the amplitude distribution of the spatial acoustic field arisen from the 8-elements linear array according to the present invention.
Figure 11:
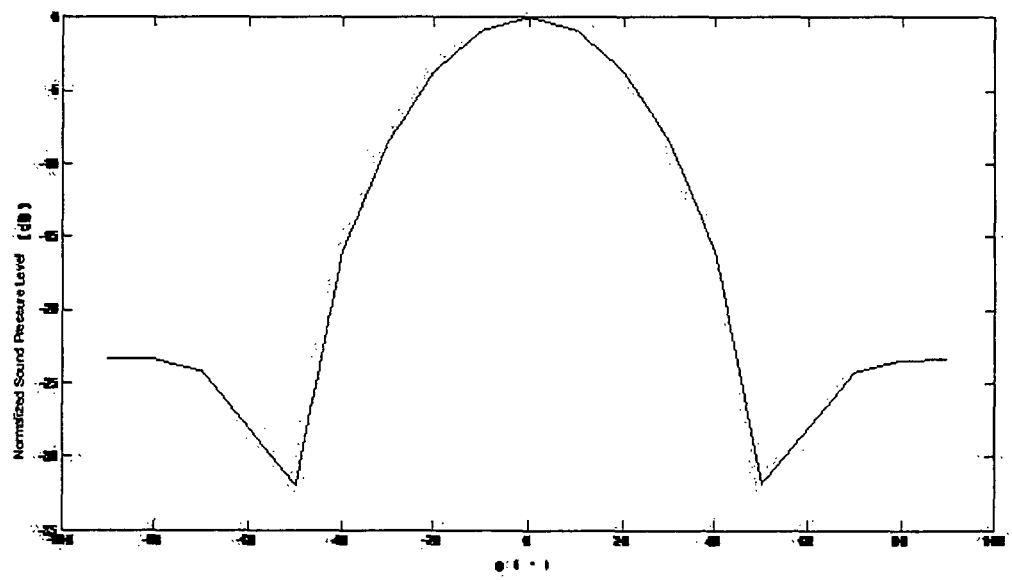
FIG. 11 is a graph showing the amplitude variation of the spatial acoustic field arisen from the 8-elements linear array according to the present invention, in which $\Theta$ is at 0 degree and $\phi$ varies from −90 degree to 90 degree.

FIG. 10 is a graph showing the amplitude distribution of the spatial acoustic field arisen from the system device according to the present invention at a radiation radius (r) of 5 m. FIG. 11 is a graph showing the amplitude variation of the spatial acoustic field arisen from the system device according to the present invention, in which ⊖ is at 0 degree and ϕ varies from −90 degree to 90 degree. It is noted that in a region neighboring the symmetry axis of the linear array, the sound pressure is flatly distributed with a small variation, while in a region far away from the symmetry axis of the linear array, the sound pressure is distributed with a severe attenuation of about 25 dB, which means the system device has a good control ability on the spatial acoustic field. By choosing a larger array aperture and more modulated bits, the system device could remain a larger sound pressure distribution in the axially symmetric region of the array, and the sound pressure distribution obviously attenuates out of the symmetric region.

Figure 12:
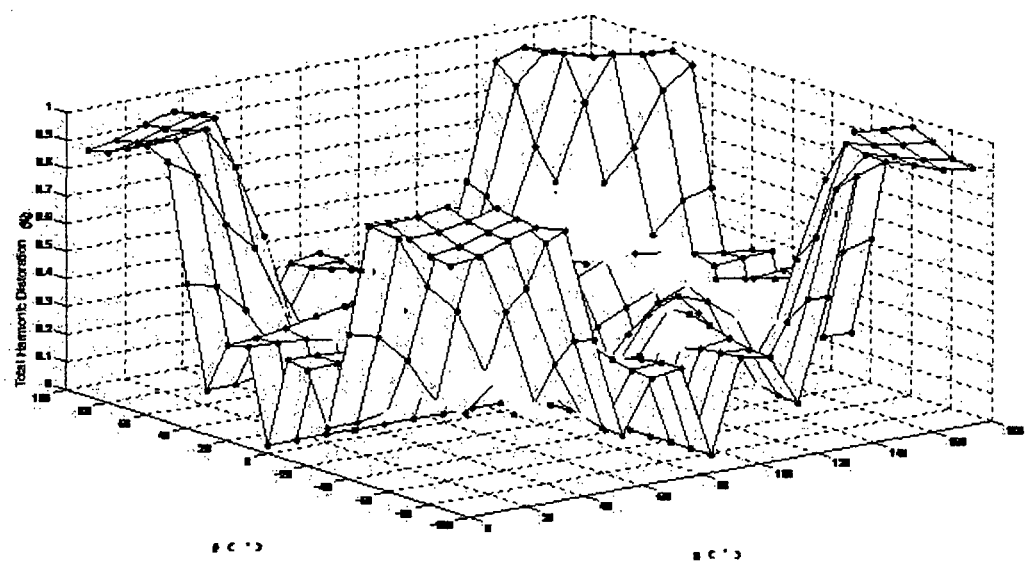
FIG. 12 is a schematic view showing the total harmonic distortion distribution of the spatial acoustic field arisen from the 8-elements linear array according to the present invention.
Figure 13:
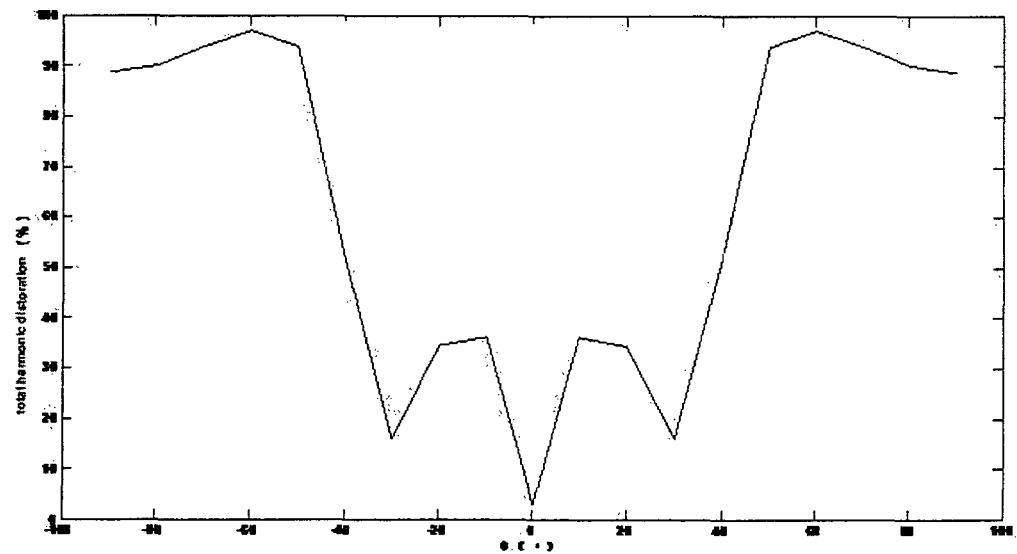
FIG. 13 is a graph showing the variation of the total harmonic distortion distribution of the spatial acoustic field arisen from the 8-elements linear array according to the present invention, in which $\Theta$ is at 0 degree and $\phi$ varies from −90 degree to 90 degree.

FIG. 12 is a schematic view showing the total harmonic distortion distribution of the spatial acoustic field arisen from the system device according to the present invention at a radiation radius (r) of 5 m. FIG. 13 is a graph showing the variation of the total harmonic distortion distribution of the spatial acoustic field arisen from the system device according to the present invention, in which ⊖ is at 0 degree and ϕ varies from −90 degree to 90 degree. It is noted that the total harmonic distortion is lower in the region neighboring the symmetry axis of the linear array, which means a good sound quality of the signals, while the total harmonic distortion rapidly increases in a region far away from the symmetry axis of the linear array, which means that the sound quality of the signals is turning bad. From the simulation curves, it is understood that when the array is provided with a larger aperture, the speaker system device according to the present invention is provided with apparent acoustic field control effect which is different from that of the conventional linear array beamforming technique. This is because the signals emitted by each array element channel of the system device are just part of the bit information of the sound signals, while the signals emitted by each array element of the conventional beamforming technique are a copy of the sound signals. For the reason that the information amount of the signals emitted by the system device element is different from each other, the generated acoustic field produces not only a variation on the sound pressure amplitude of in space, but also a variation on the harmonic distortion, the Intelligibility and the quality of the sound, which means the system device according to the present invention is provided with a better control ability on the local sound field, thus providing a better practicable method for the voice secret transmission.

The above description is meant to be exemplary only and is not limited to the example shown in the drawings and described hereinbefore, and those skilled in the art will recognize that changes may be made to the embodiment described without department from the scope of the invention disclosed. Still other modifications varied in efferent manners which fall within the scope of the present invention and their technical equivalents will be apparent to those skilled in the art, in light of a review of this disclosure, and such modifications are intended to fall within the appended claims.

What is claimed is:

1. An all-digital speaker system device, comprises:
   an A/D converter for converting the input analog audio signals into high-bit digital signals in PCM coded format;
   an interpolation filter for up-sampling, which is electrically coupled to the output end of the A/D converter;
   a Σ-Δ modulator for modulating the multi-bit Σ-Δ code and shaping noise, which is electrically coupled to the output end of the interpolation filter;
   a dynamic mismatch regulator, that takes advantage of the element selection algorithm to shape a nonlinear harmonic distortion arisen from the frequency response difference between array elements to reduce the magnitude of the harmonic distortion components in band and push the power thereof to the high frequency section out of band, the dynamic mismatch regulator being electrically coupled to the output end of the Σ-Δ modulator;
   a differential buffer for enhancing the load driving ability of the output end, which is electrically coupled to the output end of the dynamic mismatch regulator; and
   a speaker array or realizing electro-acoustic conversion, which is electrically coupled to the output end of the differential buffer.

2. The device as claimed in claim 1, wherein the interpolation filter interpolates the digital signals output from the A/D converter with an over-sampling rate, before removing the periodically continuing spectrum components in the interpolated signals by filtering.

3. The device as claimed in claim 1, wherein the Σ-Δ modulator applies a noise-shaping treatment to the over-sampling signals from the interpolation filter according to the signal processing flow of the existing Σ-Δ modulating algorithm to push the noise energy out of the sound band.

4. The device as claimed in claim 1, wherein the Σ-Δ modulator takes advantage of the shift addition operation, the parameters thereof being depicted in CSD code.

5. The device as claimed in claim 1, wherein the Σ-Δ modulator converts the N bit Σ-Δ PCM coded signals generated by Σ-Δ modulating into equal weight binary coded signals corresponding to $2^N$ transmission channels.

6. The device as claimed in claim 1, wherein the differential buffer converts the single channel digital signals sent from the dynamic mismatch regulator into twin channel differential signals.

7. The device as claimed in claim 1, wherein the elements of the speaker array comprises a plurality of speakers of moving-coil type or piezo-electric type arranged in a certain array location configuration.

8. An all-digital speaker system device, comprises:
   an A/D converter for converting the input analog audio signals into high-bit digital signals in PCM coded format;
   an interpolation filter for up-sampling, which is electrically coupled to the output end of the A/D converter;
   a Σ-Δ modulator for modulating the multi-bit Σ-Δ code and shaping noise, which is electrically coupled to the output end of the interpolation filter;
   a dynamic mismatch regulator for eliminating code errors arisen from the frequency response difference between array elements, which is electrically coupled to the output end of the Σ-Δ modulator;
   a differential buffer for enhancing the load driving ability of the output end, which is electrically coupled to the output end of the dynamic mismatch regulator; and
   a speaker array for realizing electro-acoustic conversion, which is electrically coupled to the output end of the differential buffer;
   wherein the interpolation filter interpolates the digital signals output from the A/D converter with an over-sampling rate, before removing the periodically continuing spectrum components in the interpolated signals by filtering.

* * * * *